US011792942B2

(12) United States Patent
Chiolerio (10) Patent No.: US 11,792,942 B2
(45) Date of Patent: Oct. 17, 2023

(54) APPARATUS FOR TRANSFERRING A CONDUCTIVE PATTERN TO A SUBSTRATE AND CORRESPONDING PATTERN TRANSFERRING PROCESS

(71) Applicant: FONDAZIONE ISTITUTO ITALIANO DI TECNOLOGIA, Genoa (IT)

(72) Inventor: Alessandro Chiolerio, Genoa (IT)

(73) Assignee: FONDAZIONE ISTITUTO ITALIANO DI TECNOLOGIA, Genoa (IT)

( * ) Notice: Subject to any disclaimer, the term of this patent is extended or adjusted under 35 U.S.C. 154(b) by 414 days.

(21) Appl. No.: 16/766,511

(22) PCT Filed: Nov. 22, 2018

(86) PCT No.: PCT/IB2018/059235
§ 371 (c)(1),
(2) Date: May 22, 2020

(87) PCT Pub. No.: WO2019/102398
PCT Pub. Date: May 31, 2019

(65) Prior Publication Data
US 2020/0383211 A1     Dec. 3, 2020

(30) Foreign Application Priority Data
Nov. 23, 2017 (IT) .......................... 102017000134328

(51) Int. Cl.
*H05K 3/12*  (2006.01)
*H05K 3/00*  (2006.01)
*H05K 3/28*  (2006.01)

(52) U.S. Cl.
CPC ............ *H05K 3/125* (2013.01); *H05K 3/0091* (2013.01); *H05K 3/1283* (2013.01); *H05K 3/287* (2013.01);
(Continued)

(58) Field of Classification Search
CPC .... H05K 3/0091; H05K 3/287; H05K 3/1283; H05K 3/125
See application file for complete search history.

(56) References Cited

U.S. PATENT DOCUMENTS

| 2002/0158955 | A1 | 10/2002 | Hess et al. | |
| 2004/0226929 | A1 | 11/2004 | Miura et al. | |
| 2015/0189761 | A1* | 7/2015 | Chan ..................... | C09D 11/52 427/125 |

FOREIGN PATENT DOCUMENTS

| JP | 2001-301235 | | 10/2001 | |
| KR | 20110120638 A | * | 11/2011 | ........... H05K 3/1275 |
| WO | 2015/151101 | | 10/2015 | |

OTHER PUBLICATIONS

KR20110120638A Google patents (Year: 2011).*
International Search Report and Written Opinion of the ISA for PCT/IB2018/059235 dated Mar. 8, 2019, 30 pages.

* cited by examiner

*Primary Examiner* — Thien S Tran
(74) *Attorney, Agent, or Firm* — Nixon & Vanderhye P.C.

(57) ABSTRACT

Apparatus for transferring conductive patterns to a substrate (56), comprising a module (52) configured to transfer a pattern (63) of sinterable material (63a) to said substrate (56) and an optical module (12) to perform a sintering of the transferred pattern (63a). Said apparatus comprises one or more self-propelled pattern transferring units (52) comprising a module configured to move said self-propelled unit (14, 20) over said substrate (56) under the control of
(Continued)

movement instructions (53*b*) associated to a motor (16, 21), said self-propelled unit (14, 20) comprising said module (52) configured to transfer a pattern (63*a*) of sinterable material (CI) to said substrate (56) obtaining a transferred pattern (63*a*) and comprising also said optical module (12) to perform a sintering of the transferred pattern (63*a*) on said substrate (56) obtaining a sintered pattern (63*b*, 63*c*).

15 Claims, 4 Drawing Sheets

(52) U.S. Cl.
CPC . *H05K 2203/013* (2013.01); *H05K 2203/107* (2013.01); *H05K 2203/1131* (2013.01); *H05K 2203/1377* (2013.01); *H05K 2203/163* (2013.01)

APPARATUS FOR TRANSFERRING A CONDUCTIVE PATTERN TO A SUBSTRATE AND CORRESPONDING PATTERN TRANSFERRING PROCESS

This application is the U.S. national phase of International Application No. PCT/IB2018/059235 filed Nov. 22, 2018 which designated the U.S. and claims priority to IT Patent Application No. 102017000134328 filed Nov. 23, 2017, the entire contents of each of which are hereby incorporated by reference.

TECHNICAL FIELD

The present description relates to techniques for transferring conductive patterns to a substrate, comprising a module configured to transfer a pattern of sinterable material to said substrate and an optical module to perform a sintering of the transferred pattern.

The solution in particular is directed to printing conductive wires by using sintering of inks containing metal nanoparticles sprayed on a support.

The solution refers in particular also to the printing of protective insulation layer and to a module to transfer a pattern of protective dielectric and an optical module to perform the curing of the protection

DESCRIPTION OF THE PRIOR ART

Printing, in other words transferring a pattern to a support made of a specific material, either flexible (paper, plastic) or rigid (metal, concrete, glass) involves two diametrally opposite approaches: analog and digital printing. Analog means that the geometry is first lithographed or engraved in a master and then transferred to the rigid or flexible substrate using a press or a rotative machinery. When the substrate is flexible and the movement rotary, huge printing speeds may be achieved (as high as 800 m/min over 2÷3 m width). Rigid substrates require automated or manual handling and a general translational movement (vertical press). Hence, printing speeds are much lower. Digital printing is a technology where the printhead includes controlled nozzles and is able to fire the ink in a controlled manner, meaning that in conjunction with the printhead movement any geometry can be achieved. Printing speeds on industrial printheads can achieve 500 m/min when mounted on rotary machines for flexible substrates, while industrial plotters can barely achieve 20 m/min on smaller widths (about 0.2 m) using continuous modules or 2 m/min on higher widths (1 m), and even less when the substrate is rigid. The advantages of digital printing are mainly the opportunity of changing fastly the geometry produced by acting at the software level, with no additional costs, while such a change requires manufacturing new clichés for the analog printing. Another advantage is a better ink economy.

When printing pattern such as conductive traces, i.e. wirings, for printed circuits, one of the main drawbacks of digital electronic printing is represented by the ultimate conduction level of printed traces, based on silver or copper metallic particles. Due to an incomplete volume distribution of the particles, which after sintering appear as a metallic sponge, and to surface scattering effects typical of thin films and disordered interfaces, the real conductivity of printed traces is quite low in comparison to standard wires. Therefore, a real application trying to use such means to print not only small, but also big conductive traces or wirings, such as traces to distribute energy in home applications, has to face huge voltage drops and ohmic losses. Increasing the efficiency of the sintering process is of paramount importance to bring innovative solutions closer to the market demand.

Therefore, a limitation of the known techniques is that they do not allow viable and economic printing over large areas.

Object and Summary

An object of one or more embodiments is to overcome the limitations inherent in the solutions achievable from the prior art.

According to one or more embodiments, that object is achieved thanks to an apparatus having the characteristics specified in claim 1. One or more embodiments may refer to a corresponding method.

The claims form an integral part of the technical teaching provided herein in relation to the various embodiments.

According to the solution described herein, the apparatus includes one or more self-propelled pattern transferring unit comprising a respective module configured to transfer a pattern to material to be sintered and at least a module to perform a post-treatment, in particular sintering, of the transferred pattern.

The solution described herein is also directed to a corresponding method for transferring conductive pattern to a material.

BRIEF DESCRIPTION OF THE DRAWINGS

The embodiments will now be described purely by way of a non-limiting example with reference to the annexed drawings, in which.

DETAILED DESCRIPTION OF EMBODIMENTS

The ensuing description illustrates various specific details aimed at an in-depth understanding of the embodiments. The embodiments may be implemented without one or more of the specific details, or with other methods, components, materials, etc. In other cases, known structures, materials, or operations are not illustrated or described in detail so that various aspects of the embodiments will not be obscured.

Reference to "an embodiment" or "one embodiment" in the framework of the present description is meant to indicate that a particular configuration, structure, or characteristic described in relation to the embodiment is comprised in at least one embodiment. Likewise, phrases such as "in an embodiment" or "in one embodiment", that may be present in various points of the present description, do not necessarily refer to the one and the same embodiment. Furthermore, particular conformations, structures, or characteristics can be combined appropriately in one or more embodiments.

The references used herein are intended merely for convenience and hence do not define the sphere of protection or the scope of the embodiments.

In brief, the solution here proposed is based on providing self propelled pattern transferring, i.e. printing, units, e.g. embodying portable robotic printers, so that the so provided ensemble of units is able to perform digital electronic printing covering large areas in a viable and economic manner and reducing the production time in reason of the number of units used simultaneously.

In particular, the preferred embodiment relates to a solution for increasing the sintering efficiency of each printing unit, each unit including, in addition to the means for conductive pattern transferring, means for providing a post-printing treatment, such as a solid state laser for sintering, which can be used for conductive traces, usually printed with silver nano-particle based inks that require sintering to achieve electrical percolation, and additionally a UV light for curing, which is used for treatment of acrylic or epoxy dielectric inks providing insulation/protection of printed conductive lines.

The apparatus here described can be applied to transfer pattern of different size on corresponding substrates of different material, also scaling the size of the units. For instance, PCB (Printed Circuit Boards) can be printed with units of corresponding size, although also use of bigger unit properly positioned with respect to the substrate is of course also possible to print PCB.

However, in a preferred embodiment the apparatus here described is applied to printing over big surfaces, in particular to printing of electrical plants for home installations, where the typical geometries to be printed are based on long and parallel conductive traces.

According to another aspect of the solution here described the printed traces are also used to convey energy from a central supply node, for instance connected to the mains, to each unit, whose weight and volume can be advantageously reduced, at the expenses of the battery pack size. At the same time, the energy flowing through the track is partially dispersed by means of Joule heating to increase the sintering efficiency and reduce the final resistivity of printed lines. Thus, preferably, the power consumption of each self-propelled unit, necessary to motion, wireless communication, printer and post-printing devices such as UV lamps and laser beams is obtained by a direct wiring scheme, that uses the traces printed on the substrate themselves to convey energy and to obtain simultaneously a higher yield sintering. An external control module is configured, in particular via software, to control each self-propelled pattern transfer unit through a wireless link and to assign a portion of the total trace scheme to each unit which is available for the task, i.e. online, optimizing production time and complexity.

According to another aspect of the solution, the apparatus also includes a pick-up wheel in the self-propelling unit, used to simultaneously electrically sinter the traces and power the unit, which is also configured to apply a mechanical pressure to compact the metallic sponge of the sintered traces and to further reduce surface scattering effects. The units are configured to perform treatments like laser-assisted pre-sintering, electrically assisted further sintering, mechanically assisted post-sintering, which are particularly effective on hybrid inks, where a metallic nano-particle component is hosted in a polymeric matrix. The laser pyrolyses the polymeric matrix leaving a spongy metallic structure, further made percolative by the electrically assisted process and compacted by the mechanical pressure.

Figure 1:
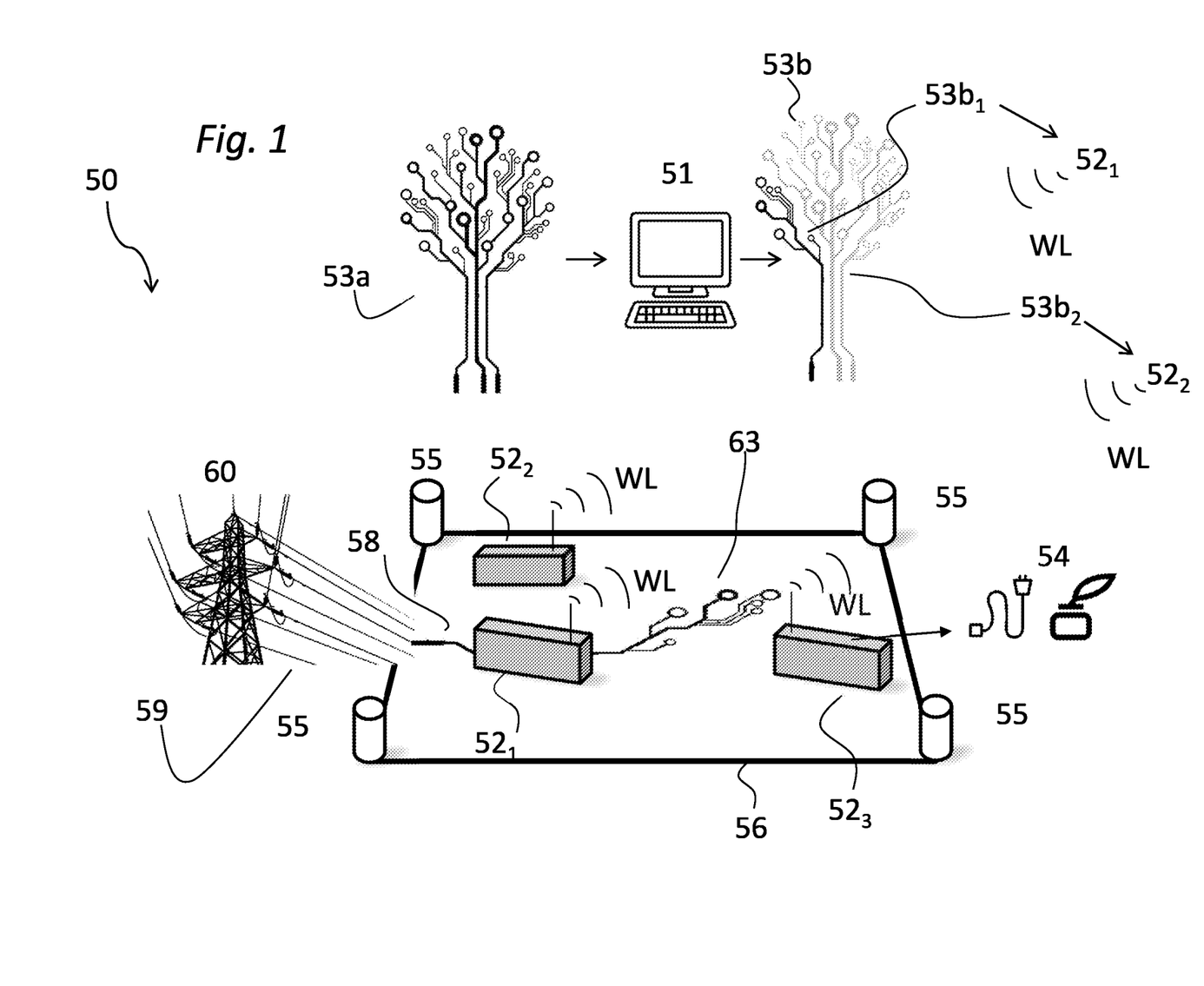
FIG. 1 is a schematic diagram representing the apparatus here described.

In FIG. 1 is shown schematically an apparatus 50 comprising a central control module 51 comprising a processor module, in the example shown a personal computer, and a plurality of self-propelled pattern transferring units 52, indicated respectively as $52_1$, $52_2$, $52_3$, each one corresponding to an autonomous robotic ink-jet printing machine, that is the pattern transferring to a substrate 56 is obtained by ink-jet printing of conductive ink. Self-propelled units 52 collectively operate as a robotic pattern transferring apparatus, i.e. a collective printing apparatus, that may be seen as a collective robotic printer. The connection between each self-propelled unit 52 and the central control module 51 is embodied by means of a wireless link, or wireless channel, WL which can be obtained by a using a commercial wireless transmission platform such as Bluetooth, or IEEE 802.11, Zigbee, and others. The wireless link WL is obtained by corresponding wireless transceivers associated to the control module 51 and self-propelled units 52. The embodiment shown in FIG. 1 includes four wireless beacons 55, which operate with radio signals like the wireless link WL, but can also operate by infrared radiation. Such wireless beacons 55 can be manually positioned close to the four angles of the support or substrate 56, which defines the working area of units on which the pattern, indicated with 63 in the following, is to be transferred. Each self-propelled unit 52 is configured to detect the towers 55 and position itself in the correct way, with respect to a reference point, i.e. an origin point, in a positioning reference system.

Figure 2:
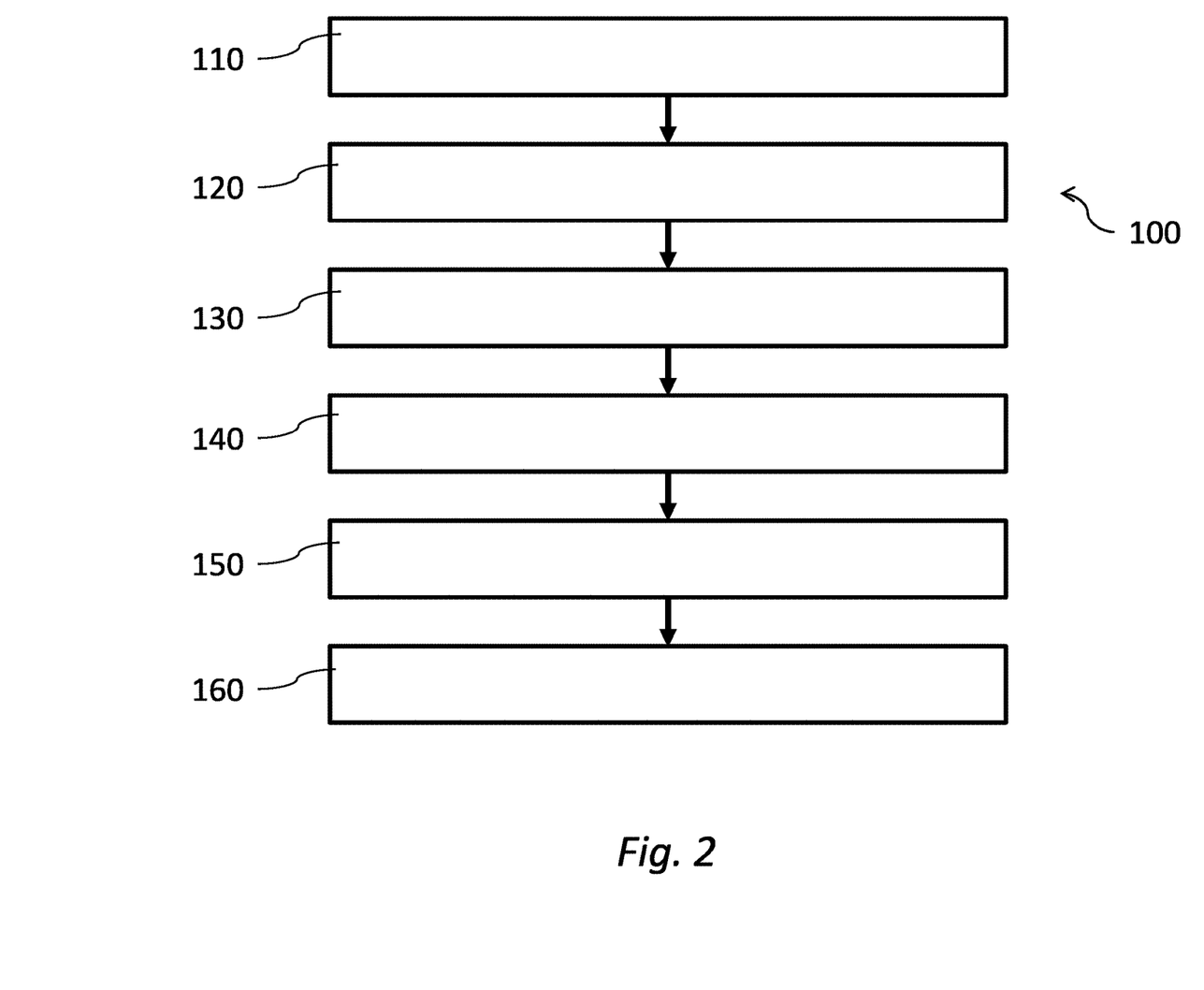
FIG. 2 is a flow diagram representing a method of pattern transferring using the apparatus of FIG. 1.

The control module 51 receives (or has available stored in memory) a schematics file 53a in graphic format. The control unit 51 can be configured to process both bitmaps and vectorial files. The control module 51 is configured to obtain from such schematics file 53a an instruction file 53b for the units 52, represented either as a sequence of bits of different color depth or as a sequence of instructions to plot lines, regular poligons and points (for instance the instructions can correspond to G-code instructions usually used for driving robot machines). The color depth information channel can be used to store details about the functional property assigned to the specific bit/object: black=conductive, white=dielectric, and so on. There are several methods known to the person skilled in the art to produce a routing layout from a bitmap file (i.e. .bmp, .tiff, .jpg) or from a vectorial file (high level, such as .ai, .dxf, .dwg, .pdf or low level, such as .plt, gcode); typically routing layouts are created with well known Electronic Design Automation (EDA) utilities in .ai format (such as Autodesk® EAGLE) in proprietary format and then exported to .pdf for the printing step. In FIG. 2 it is shown an embodiment of a method of pattern transferring method 100 using the apparatus 50 of FIG. 1, corresponding to a pattern production cycle.

In a step 110 the control module 51 acquires the schematics file 53a showing the geometry to be printed, i.e. performs a bitmap or vector field acquisition. As mentioned, the schematical file 53 can be acquired from an external source, i.e. another computer or through a communications network, or can be acquired from a memory, i.e. a mass memory or an external memory device such as USB memory stick, of the control module 51.

Then, in a step 120, the control module 51 acquires the number of pattern transferring units 52 composing the set of self-propelled units 52 in the support 56, which can also be defined as a swarm of self-propelled units 52, and available for the printing job, i.e. the units 52 which are online, connected to the wireless link WL and ready for performing the task, for instance free from warning flags, having enough ink in the cartridges. In the example shown such units are units $52_1$, $52_2$.

Regarding the level of ink in the cartridges of the units 52, the self-propelled pattern transferring units 52 are also programmed to reach a refilling station 54 whenever the ink level goes below a warning threshold and carry LED indicators to show immediately a corresponding empty ink signal like unit $52_3$.

Once the available population of pattern transferring units 52 is determined in step 120, the control module 51 performs a job segmentation operation 130 in which processes the input map, represented by the schematics file 53a, to optimize printing time, producing an instruction file 53b assigning to each unit 52 a respective portion of the printing task.

In the geometry commanded by the instruction file 53b, it is assigned a portion $53b_1$ of the geometry to be printed by the autonomous unit $52_1$, and another portion $53b_2$ to be printed by unit $52_2$. The area and position of the substrate 56 to be printed, defining the working area can be acquired by various methods. In FIG. 1 as mentioned, are shown the four wireless beacons 55, manually positioned close to the four angles of the substrate 56, which defines the working area of units 52, so that each unit 52 is configured to detect the towers 55 and position itself in the correct way, with respect to a reference point in a positioning reference system.

In variant embodiments, it can be a manual setting of the area and position data or an autonomous optical recognition performed by one of the units 52 involved in a random walk to find and follow the edges of the substrate 56. As an alternative and faster way four IR towers/four wireless beacons 55 can be manually positioned close to the four angles of the support or substrate 56. Each unit 52 is configured to detect the towers 55 and position itself in the correct way, with respect to a reference point, i.e. origin, in a positioning reference system.

The substrate 56 on which the working area is defined is the support on which surface the pattern must be printed and can be of different material, for instance paper, plastic, glass, metal, rigid or flexible put in a planar canvas.

Figure 3:
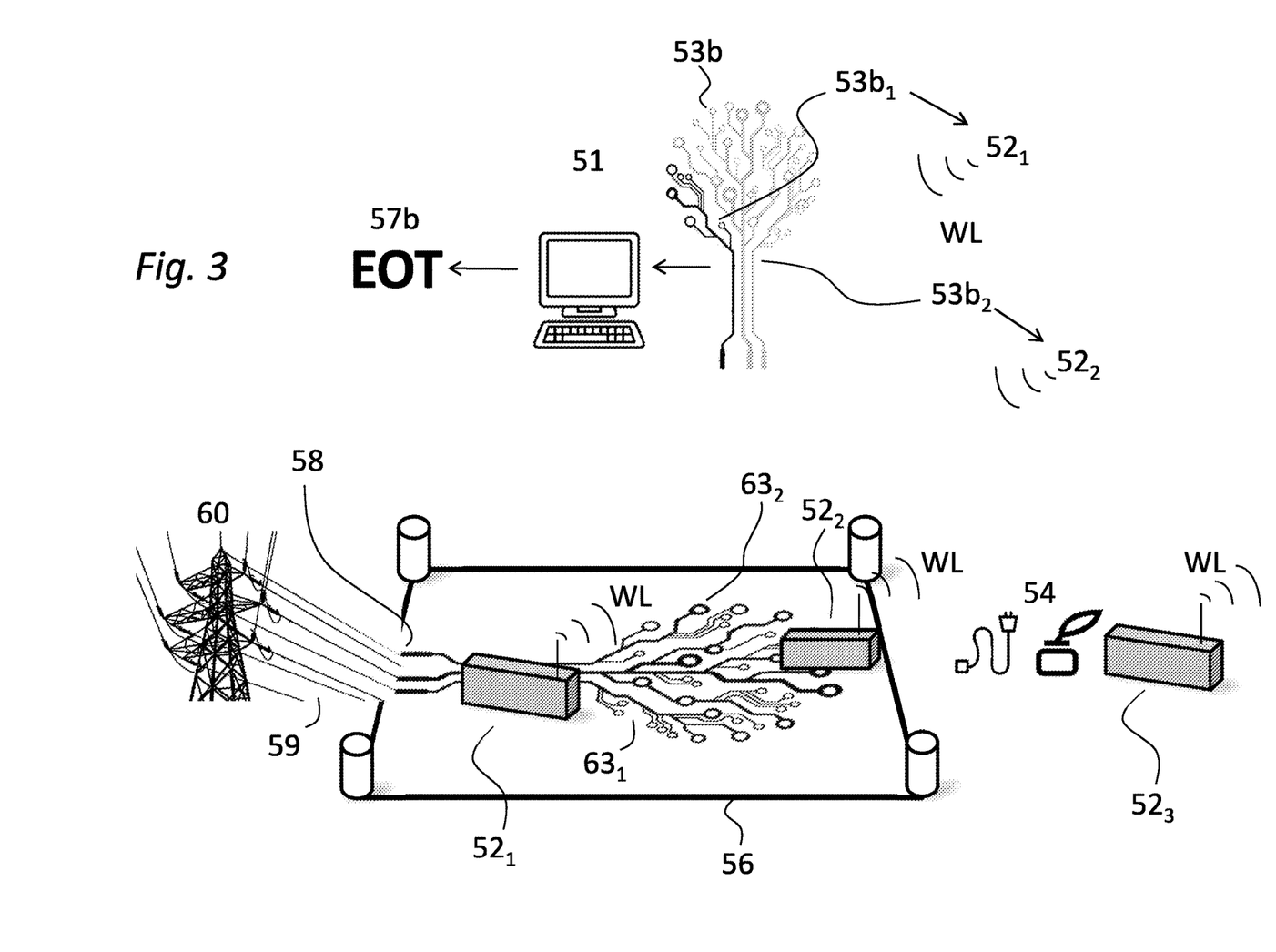
FIG. 3 is a schematic diagram representing the apparatus here described in a second configuration of operation.

After step 130, the printing job takes place. The apparatus 50 performing the operations (140-160) of the printing job is shown in FIG. 3, which shows unit $52_1$, $52_2$ printing a printed pattern 63 corresponding to the graphic pattern 53a as commanded by the instruction file 53b. As it can be seen, the printed pattern 63 includes macroscopic connection pads 58 (which printing is also programmed through pattern 53a/instruction file 53b) and a wired channel 59, connected to electric mains 60.

The pattern transferring units 52 reproduce the portion of geometry 53b assigned by the control unit 51 as shown in FIG. 3 using functional inks available in their reservoir, as better detailed with reference to FIG. 4. In FIG. 3 both units $52_1$, $52_2$ have completed their individual tasks printing respective portions $63_1$, $63_2$, corresponding to portions $53_{b1}$, $53_{b2}$ of the instruction file 53b, while unit $52_3$ is shown connected to the refilling pit 54. During the printing job, each unit 52 is configured to send its telemetry data and progress in performing the task of printing the respective pattern portion through the wireless channel WL to the control unit 51, which is in its turn configured to plot in real time the advancement of the task defined through file 53a and, at completion, acknowledges for instance with an End Of Transmissions flag 57b.

It is noted that when the source code format is vectorial, it is difficult to estimate the printing speed, which could be affected by the coverage (fraction of support covered by the ink) more than other factors; when the source code is bitmap, regardless of coverage, the printing speed depends on the number of available units 52.

In a preferred embodiment, a first step of the printing job, after the job segmentation operation 130, is represented by the printing, indicated with 140, of such macroscopic connection pads 58 to obtain a connection to the mains line 60, used to directly power the printing units 52 through the wired channel 59 offered by the geometry to be printed (by portion $63_2$ in particular in the example). Then, the pattern printing step 150 is performed, taking advantage of two further physical mechanisms (Joule heating and mechanical pressure) to sinter the traces 60. With 160 is the indicated a monitoring operation performed by the control unit 51 till the end of the transmission 57b of the instruction file 53b, i.e. the end of the printing job by online units 52.

The printed pattern 63 of FIGS. 1 and 3 is the pattern of conductive traces of a PCB (Printed Circuit Board). The apparatus 50 can be however efficiently applied for the printing of electrical plants for home installations, where the typical geometries to be printed are based on long and parallel conductive traces, which would represent in this case the printed pattern 63.

Figure 4:
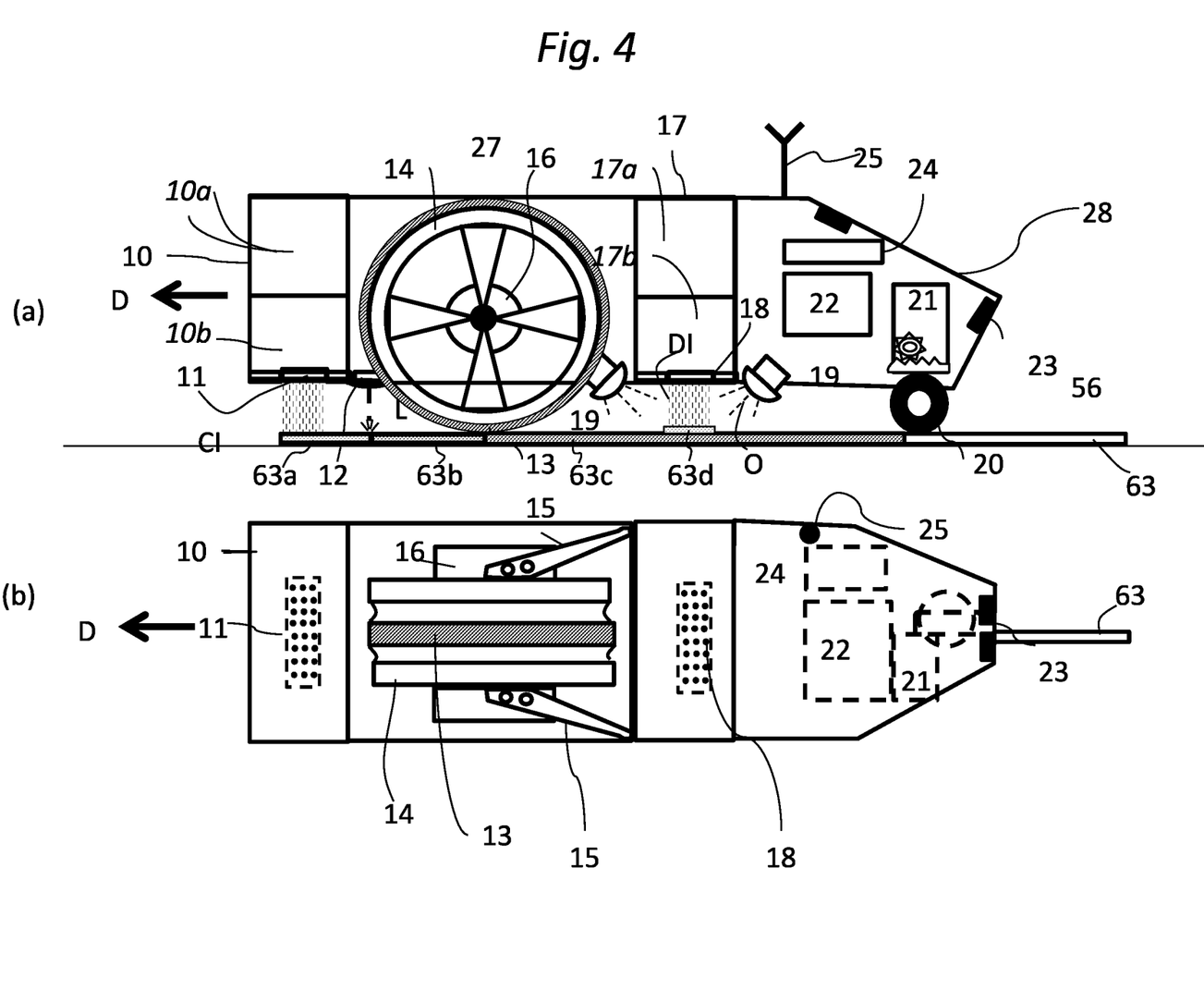
FIG. 4 is a schematic diagram representing a unit of the apparatus here described.

To better understand the method of FIG. 2, in FIG. 4 it is shown schematically a self-propelled pattern transfer unit 52. In FIG. 4a is shown a side view of the unit 52, while in FIG. 4b is shown a top view.

The self-propelled pattern transfer unit 52 shown in FIG. 4 is substantially in the form of a two-wheeled vehicle, having a central body 27 in the form of a parallelepiped housing in which is housed a single central wheel, indicated here as front wheel 14, rotating substantially about an axis perpendicular to the longitudinal axis of the unit 52. The central body 27 includes on its side facing down (in the direction of the substrate 26) an optical sintering module 12, configured to perform the photonic sintering of the electro-conductive functional ink, for instance a laser DPSS (Diode Pumped Solid State) sending nanosecond length pulses in the infrared field. In variant embodiments a laser diode, or a fiber laser can be used. The laser optical power is preferably included between 1 and 100 W, with fixed focus, aligned to the trace being printed.

With D is indicated the direction of movement of the unit 52, aligned to the longitudinal axis of the unit 52, which defines a front wall and a rear wall of the central body 27.

Attached to the front wall of the central body 27 is a conductive ink printing module 10, representing substantially the nose of the robot vehicle obtained by the unit 52, while to the rear wall is attached a dielectric ink printing module 17. The modules 17, 10 are also parallelepiped in shape with a transverse dimension corresponding to that of the central body 27, so that they combine with such central body 27 to obtain a longer three segments parallelepiped body.

An end segment 28 corresponding to the trunk of the vehicle, is supported by a rear steering wheel 20 aligned to the front wheel 14.

The end segment 28 includes, on its bottom surface, facing the substrate 56, an optical module 19 for curing the dielectric ink, in particular by photoreticulation of the dielectric ink. A corresponding module 19 is also arranged on the bottom of the body 27 so that the optical ultraviolet beams of the two modules can be oriented to meet in the region where the dielectric ink DI is printed by a corresponding printing head 18 in a module 17.

The end segment 28 includes also electrical motors 21, preferably numerically controlled, for actuating the rear steering wheel 20, for instance on the basis of instructions 53b, a rechargeable accumulator 22 to store the electric power, sensors 23, such as proximity sensors, which are configured, during the movement of the unit 52 to detect obstacles or identify the printing area, as indicated above. Sensors 23 are shown in the embodiment of FIG. 4 as arranged only on the end portion 28, however they are preferably distributed along all the perimeter of unit 52.

The end segment 28 includes also an electronic unit control module 24 which controls the motors, the printing modules, optical modules and sensors of the unit 52, and includes also an antenna 25, with a corresponding wireless transceiver, as mentioned above, to communicate with the central module 51 and with the other units 52, over the wireless link WL.

The electronic unit control module 24 in particular includes a wireless communication system, for instance a Bluetooth communication module, using the antenna 25 to wireless communicate with the central control module 51. The unit control module 24 can include a memory and a programmable processor, for instance be similar to the print processors implemented in inkjet desktop printers. This processor can be used for the control of the printing process alone, other processors in module 24 attending to the communication, actuation and sensing, as well as navigation and monitoring functions, or such functions can be also performed, all or a part, by the such print processor.

More in detail the conductive ink printing module includes a disposable cartridge 10a containing electro-conductive functional ink CI. The cartridge 10a is an oblong container, including in the upper part a liquid reservoir 10b, for the ink, then below is arranged a sponge 10c, which makes homogeneous the ink distribution and generating the necessary negative pressure for the ink jet head 11 arranged on the bottom of the cartridge facing the support 56. Where a positive pressure is needed to eject the ink, the sponge is not present and the cartridge is pressurized.

Such printing head 11 is a MEMS head, electronically controlled by the electronic unit control module 24, producing an array of ink drops having controlled volume and speed, to obtain a pattern synchronizing the emissions with the movements of the unit 52. Heads 11, which can be f the type commercially available, can be obtained by piezoelectric, magneto-strictive or electrothermal devices.

The front wheel 14 is in the first place much greater of the rear wheel 20 both in diameter and in thickness, so that the unit 52 is balanced in a stable manner with the help of the other support point offered by the rear wheel 20. This of course can be helped by carefully distributing inner masses to avoid unbalance. As shown in FIG. 4, for instance the thickness of the wheel is one third of the width of the body 27, in the transversal direction.

The front wheel 14, which is mainly made of metal, has a rubber covered rim, in order to have a greater friction and to transmit the torque of motors 21 to the support 56 and thus move the unit 52. In the central portion of the rim is placed an electro-conductive rail 13, or electro-conductive track, i.e. a metal rail or stripe running along all its circumference. Such electro-conductive rail 13 is used to complete sintering of the conductive trace 30, closing an electrical circuit through which the unit 52 is supplied with DC current. Such electro-conductive track 13 is also configured to apply a mechanical pressure compressing the trace, helping in closing the typical residual porosities of the printed and sintered metal traces, exploiting the plasticity of the material heated by the passage of the current.

The unit control module 24 also manages the accumulator, or battery, 22 for storing the energy acquired through the front wheel 14 and the band 13 and for accessing such energy stored in the accumulator 22 when the unit 52 is not in electrical connection with a supply line 30 through the front wheel 14. The accumulator 22 preferably integrates a power management system, although this function can be demanded to the unit control module 24.

In FIG. 4 with 15 are indicated mechanical suspension arms connected to the hub of the front wheel and to the body 27, which are used to apply continuously such mechanical pressure by means of a respective string not shown in FIG. 4. In FIG. 4 it is indicated a possible example of active suspensions mounting, although in variant embodiments other possible mountings are possible, which are per se known to the person skilled in the art. Such suspensions in the simplest embodiment are composed by a spring-damper mechanical link between the wheel 14 and the body 27 shell, equipped with a force sensor and an oleodynamic pump to control the pressure exerted on the printed trace.

Connected to the hub of the front wheel 14 is also connected the axle of a numerically controlled electrical motor 16 which actuates the front wheel 14. This is for instance a tubular motor placed with its main axis transversal with respect to the longitudinal axis of the unit 52 and the plane of the wheel 14, connected, as mentioned, to its hub, possibly through a gearbox to adjust the proper angular velocity, to actuate the wheel 14.

The dielectric ink printing module 17 includes also a respective disposable cartridge 17a containing dielectric functional ink DI to obtain insulated crossings between the subsequently printed traces or the passivation and protection of traces. The cartridge 17a also is an oblong container, including in the upper part a liquid reservoir 17b, for the ink, then below a sponge 17c which makes homogeneous the ink distribution and generating the necessary negative pressure for the ink jet printing head 18 arranged on the bottom of the cartridge 17a facing the substrate 56. Where a positive pressure is needed to eject the ink, the sponge is not present and the cartridge is pressurized.

The ink jet print head 18, like the ink jet printing head 11, is a MEMS head, electronically controlled by the electronic control module 24, producing an array of ink drops having controlled volume and speed, to obtain a pattern synchronizing the emissions with the movements of the unit 52.

The optical module 19 for curing includes an arrangement of LEDs to perform photoreticulation of the dielectric functional ink DI, in particular inks containing radical or cationic or anionic photoinitiators, for instance UV LEDs or blue (visible) LEDs, or infrared LEDs; in case of inks including thermal photoinitiators the optical module 19 can contain an infrared lamp.

In variant embodiments, the mechanical load applied by the front wheel 14 can be measured in real-time by a pressure sensor, such as a strain-gage, configured to measure the pressure applied to the just printed track on the substrate 26, using the sensor electrical readout in a feed-back loop to adjust its value by means of an active system, for example an electric/pneumatic/oleodynamic actuator, in place of the steel spring which can be used for suspensions 15.

Although the units 52 discussed so far are robotic printer on two or four wheels for moving on planar supports, such as support 26, in variant embodiments the locomotion mechanism may be different.

Thus, in view of the unit 52 detailed with reference to FIG. 4, the printing step 150 can now be better detailed also.

The pattern printing step 150, as explained, uses silver (or other metal) nano-particles for conductive traces of the pattern 63 contained in the electro-conductive ink CI and epoxy/acrylic matrices for dielectric traces contained in the dielectric ink DI. The electro-conductive ink CI, which is sprayed by the inkjet head 11 in a sprayed trace 63a, requires a thermal post printing treatment to achieve electrical percolation, through the sintering of metallic nano-particles the sprayed track 63a, which is usually obtained by means of hot plates, laser beams, high energy flashes, etc. As shown, the units 52 include each a respective optical sintering module 12 for this purpose, e.g. a solid state diode laser which is associated to focusing lenses and eventually steering mirrors to drive the laser beam L on the printed sprayed traces 63a, which have just printed by the head 11, obtaining a pre-sintered electro-conductive trace 63b. The method here described can, in variant embodiments, perform only the laser sintering using the module sintering which produces the trace indicated as pre-sintered, or partly sintered, electro-conductive trace 63b in FIG. 4, i.e. the degree of sintering attained by the laser of module 12 can be considered sufficient to obtain the final sintered pattern 63. However, in the preferred and exemplary embodiments shown in FIG. 4, the sintering by the laser of module represents only a pre-sintering process, which is then completed, or improved by means of an electrically assisted process, exploiting Joule heating. This electrically assisted process is obtained by transferring electrical energy through the same printed traces, i.e. in particular the pre-sintered portion 63b itself, to the metal electro-conductive band 14 of the unit 52. Energy is transferred directly to such metal wheel portion, i.e. band 13, touching the traces of pattern 63, i.e. trace 63b, positioned behind the sintering equipment, so that the contact is always granted through solid metal, avoiding to damage liquid un-sintered traces, i.e. sprayed traces 63a, as well as avoiding corrosion of the sintering band 13 placed on wheel 14 from chemical attack by un-sintered ink. As already indicated, the wheel 14 determines an enhanced sintering treatment where an electrically assisted sintering process takes place while a mechanical sintering is also being performed by compaction of the printed and pre-sintered metallic sponge represented by the pre-sintered trace 63b, finally obtaining a compacted sintered trace 63c.

It is noted that it is also possible for the unit 52 to send a sintering current in the other direction, i.e. from the battery 22 of the unit 52 to the pre-sintered portion 63b, however this would discharge the battery 22, whereas exploiting the current from the mains 60, as explained previously, both allows to obtain all the current that is need for sintering and also to charge the battery in the same time.

The printing operation 150 can also include a curing step of the dielectric inks DI by means of the optical module 19, i.e. LED modules, emitting a radiation O, which is for instance a visible radiation. Each unit 52 may be responsible for the post-printing treatment of the self-printed traces, as in the unit shown in FIG. 4, or there may be, in variant embodiments, a specialized post printing set of units 52 that operates after the work performed by the printing swarm. In FIG. 4 it is indicated a dielectric layer 63d, sprayed in this example by the head 18 over the compacted trace 63c and cured by the LED optical modules 19, which can correspond for instance to an insulation layer.

The final printed pattern 63 is the ready-to-use metallic (typically silver made) circuit equivalent to the standard Printed Circuit Board (PCB) fabricated through subtractive processes.

Thus, summarizing the step 150 includes:
a step of spraying or jetting the conductive ink CI on the substrate 26 in a sprayed trace 63a, in particular;
a step of performing a laser sintering on the sprayed trace 63a of conductive ink CI. As mentioned in a preferred embodiment this is followed by
a step of simultaneous electrical and mechanical sintering, in particular achieved by the front wheel 14.

Also the step 150 can include an additional step of spraying or jetting the dielectric ink DI on the substrate 56 in dielectric traces or protections, by the head 17, which are then, once the traces made of of dielectric ink DI lie on the substrate 56, cured by the optical modules 19, in particular by using ultraviolet light emitted by LEDs.

Thus, the advantages of the method and system just disclosed are clear.

The apparatus and method described allows performing digital electronic printing covering large areas in a viable and economic manner.

The combination of laser pre-sintering, electrical sintering and mechanical pressure applied is able to better compact the metallic particles. As a result, the printed conductive traces can be compared to standard wires for home application in terms of conductivity.

The apparatus may comprise a plurality of printing units (i.e. a swarm), each of which has an assigned printing area. This enables to print on larger areas with scalable speed based on the number of units connected to the control system.

The apparatus does not need any expensive element, neither for printing, since ink can be deposited with standard techniques such as ink-jet, nor for sintering thanks to the laser and the pick-up wheel included in the print unit.

The apparatus can work on different rigid substrates such as metal or glass or even flexible substrates such as polymers, placed on a rigid substrate, and using every kind of conductive ink.

The apparatus can be used for direct printing of lighting and electrical wirings/connections inside homes, also involving electrochromic/electroluminescent/LED assemblies.

The use of a plurality of units (swarm-bot) is particularly convenient with respect to industrial devices, in particular for applications such as glass printing. The interest for high tech lightning makes it particularly attractive to directly print conductors on glass to route LED matrices, for technical walls and roofs.

Of course, without prejudice to the principle of the embodiments, the details of construction and the embodiments may vary widely with respect to what has been described and illustrated herein purely by way of example, without thereby departing from the scope of the present embodiments, as defined the ensuing claims.

To reduce device complexity, many available locomotion strategies could be used for moving on a planar substrate, involving only two wheels submitted to different speeds/rotation directions.

The invention claimed is:
1. An apparatus for transferring conductive patterns to a substrate,
comprising a module configured to transfer a pattern of sinterable material to said substrate and an optical module to perform a sintering of the transferred pattern,
said apparatus comprising one or more self-propelled pattern transferring units comprising a module configure to move said self propelled unit over said substrate under the control of movement instructions associate to a motor, said self propelled unit comprising said module configured to transfer a pattern of sinterable material to said substrate obtaining a transferred pattern and comprising also said optical module to perform a sintering of the transferred pattern on said substrate obtaining a sintered pattern, wherein said apparatus includes a module configured to apply a current to the sintered pattern to compact said sintered pattern obtaining a compacted sintered pattern.

2. The apparatus according to claim 1, wherein said optical module comprises a solid state laser configured to sinter the transferred pattern on said substrate obtaining a sintered pattern.

3. The apparatus according to claim 1, wherein said one or more self propelled pattern transferring units further comprises a module configured to transfer a respective pattern of dielectric material to said substrate and a module configured to emit light for curing said dielectric material transferred to said substrate to obtain said dielectric pattern.

4. The apparatus according to claim 1, wherein said module is configured also to apply a mechanical pressure on said sintered pattern to obtain said compacted sintered pattern.

5. The apparatus according to claim 1, wherein said module is configured to establish an electrical contact with said sintered pattern to draw electrical power when said sintered pattern is electrically connected to an energy supply source.

6. The apparatus according to claim 5, wherein said module configured to apply a current to the sintered pattern and to apply a mechanical pressure on said sintered pattern to compact said sintered pattern includes at least a wheel comprising a conductive band on its rim associated to means for applying said mechanical pressure, said wheel being comprised in said module for moving said self propelled unit under the control of movement instructions.

7. The apparatus according to claim 3, wherein said module includes battery accumulator and the unit is configured to charge said battery accumulator with current drawn through said module or wheel.

8. The apparatus according to claim 1, wherein said sinterable material is an ink including metal nano-particles, and said module configured to transfer a pattern of sinterable material obtaining a transferred pattern includes a ink-jet printing head.

9. The apparatus according to claim 1, wherein said apparatus comprises a central control module comprising a processor module, each self-propelled unit being connected to said central control module by means of a wireless communication channel, each self-propelled unit being configured to detect said beacons to position itself,
the control module being configured to receive a schematics file in graphic format and to obtain from the schematics file an instruction file corresponding to a pattern to be transferred or printed and to transmit the instruction file to the self-propelled units over said wireless channel.

10. The apparatus according to claim 1, wherein said module configured to move said self propelled unit over said substrate under the control of movement instructions associated to a motor includes an electric motor to actuate movement means of the self-propelling unit, and a control module to control said electric motor on a basis of said movement instructions or instruction file.

11. A method for transferring conductive patterns to a material,
comprising transferring a pattern to a material to be sintered and a optically performing a sintering of the transferred pattern,
wherein
comprises performing said transferring a pattern of sinterable material to a substrate and optically performing a sintering of the transferred pattern by the apparatus comprising one or more self propelled pattern transferring units according to claim 1.

12. The method of claim 11 wherein said method includes:
a step of acquiring a schematics file showing the geometry to be printed, in particular a a bitmap or vector field acquisition,
a step of acquiring the available units for printing;
a job segmentation step producing an instruction file assigning to each unit a portion of the printing steps;
printing a printed pattern by the available units corresponding to the acquired pattern as commanded by the instruction file, said printing operation including printing connection pads connectable to a mains line and a pattern printing step of the pattern,
monitoring operation performed by the external control unit till the end of the transmission of the instruction file.

13. The method of claim 12, wherein said pattern printing step includes:
a step of spraying or jetting the conductive ink on the support in a sprayed trace;
a step of performing a laser sintering on the sprayed trace of conductive ink.

14. The method of claim 13, wherein said pattern printing step further includes:
a step of simultaneous electrical and mechanical sintering.

15. The method of claim 13, wherein said pattern printing step further includes an additional step of spraying or jetting the dielectric ink on the support in dielectric traces or protections, and a step of curing said dielectric traces or protections.

* * * * *